June 4, 1968 M. HORNIG ET AL 3,386,893
METHOD OF PRODUCING SEMICONDUCTOR MEMBERS BY ALLOYING METAL INTO A SEMICONDUCTOR BODY
Filed Sept. 13, 1963
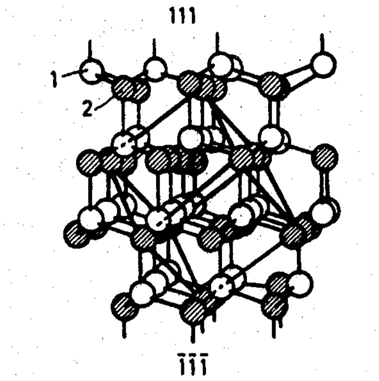

United States Patent Office 3,386,893

Patented June 4, 1968

3,386,893

METHOD OF PRODUCING SEMICONDUCTOR MEMBERS BY ALLOYING METAL INTO A SEMICONDUCTOR BODY

Martin Hornig and Hartmut Seiter, Munich, Germany, assignors to Siemens Aktiengesellschaft, Munich, Germany, a corporation of Germany Filed Sept. 13, 1963, Ser. No. 313,139
Claims priority, application Germany, Sept. 14, 1962, S 81,455
14 Claims. (Cl. 204—15)

ABSTRACT OF THE DISCLOSURE

Method of producing semiconductor members by alloying metal into a semiconductor crystal. Workpiece is a monocrystal of semiconductor compound having a zinc-blende lattice with surfaces in 111-planes. The crystal is subjected to electrolysis in an alkaline electrolyte containing a complex compound of the metal to be alloyed, whereby the metal selectively precipitates only upon the $\overline{111}$-surface of the crystal. Thereafter, the precipitated metal layer is alloyed into the crystal.

Our invention relates to the production of semiconductor members by electrolytic precipitation of metal upon given faces of semiconductor bodies and subsequently alloying the metal into the semiconductor bodies. More particularly, the invention relates to the production of semiconductor members from monocrystals of semiconductor compounds which crystallize in the zinc-blende (sphalerite) lattice such as $A^{III}B^{V}$ compounds (phosphides, arsenides and antimonides of aluminum, gallium or indium) or $A^{II}B^{VI}$ (compounds of zinc, cadmium or mercury with sulphur, selenium or tellurium).

There are several known methods of electrolytically depositing metals upon predetermined surface areas of such semiconductor bodies. These methods require applying a masking varnish to those surfaces upon which no metal deposition is to occur, then subjecting the crystalline body to electrolytic deposition of metal upon the surface area that remains exposed, and subsequently removing the masking varnish.

It has been observed that the masking varnish will scale off locally from the covered areas in the alkaline electrolytic baths being employed, so that the additionally exposed localities of the semiconductor body become accessible to undesired metallization. The subsequent removal of metal from these localities is often difficult and may involve a considerable loss of time. In many cases the removal of metal also impairs the lifetime of the minority charge carriers in the semiconductor.

It is an object of our invention to devise a method that affords obtaining an electrolytic deposition of metal upon given surfaces of a semiconductor crystal in the production of fused or alloyed electrodes on semiconductor members, without the necessity of employing a covering varnish or other masking means, thus avoiding the disadvantages of the above-mentioned known methods. More particularly, it is an object of the invention to achieve such a selective deposition of metal upon a predetermined surface portion of a semiconductor body consisting of a compound which crystallizes in the zinc-blende lattice.

According to our invention, the method of producing semiconductor members by alloying at least one metal into a semiconductor body is carried out by employing a monocrystal of semiconductor compound crystallizing in the zinc-blende lattice that has surfaces extending in 111-planes, and we perform the deposition of the metal upon the monocrystal in an alkaline electrolyte bath that contains the metal in form of a complex compound. As a result, a metal layer is selectively precipitated upon one of the 111-plane faces; and we thereafter alloy this layer into the semiconductor crystal by heating the crystal to the alloying temperature in the conventional manner.

According to another feature of the invention, we employ a dendritic monocrystal, namely a generally ribbon-shaped monocrystal of one of the above-mentioned compounds, having its two ribbon surfaces located in 111- and $\overline{111}$-faces respectively of the zinc-blende lattice. Another way of practicing the invention is to perform the selective electrolytic deposition of metal upon a disc or wafer of a semiconductor material cut from a monocrystalline semiconductor body in such a direction that the large surface areas of the disc or wafer extend in 111-planes of the crystal.

The invention is particularly applicable to the above-mentioned $A^{III}B^{V}$ compounds, namely gallium arsenide, gallium phosphide, gallium antimonide, indium arsenide, indium phosphide, indium antimonide, and also to the corresponding arsenide, phosphide and antimonide of aluminum. Also suitable for the purposes of the invention are the $A^{II}B^{VI}$ semiconductor compounds, particularly zinc sulfide, zinc selenide, cadmium sulfide and cadmium selenide, as well as the corresponding tellurides.

For further explaining the invention, reference will be made to the accompanying drawing which shows in schematic perspective the crystal lattice of gallium arsenide as a representative of the above-mentioned group of $A^{III}B^{V}$ compounds of the sphalerite lattice type. As is apparent from the illustration, the gallium atoms 1 form the outermost row of atoms at the 111-face. The arsenic atoms 2 of the semiconductor compound form the outermost atoms at the $\overline{111}$-face.

Each individual atom forms a triple bond within the lattice. The tri-valent $A^{III}$-atoms, in this case the gallium atoms, are thus saturated as to valency. Since the $B^{V}$ atoms, in the example those of arsenic, are penta-valent, the triple saturation within the lattice leaves the arsenic atoms with a free, unbounded electron pair, so that at the $\overline{111}$-face there exists a higher reaction ability relative to electrophile agents than at the 111-face. The difference in occupation of the outermost atom rows at the two faces thus results in a difference of the electrochemical potentials at the respective faces. That is, in a gallium arsenide crystal, the arsenic side is by about 300 mv. more electronegative than the gallium side.

The differences between the electrochemical potentials of the $\overline{111}$- and 111-faces on zinc-blende lattice crystals of $A^{III}B^{V}$ compounds has first been observed in etching tests made with $A^{III}B^{V}$ crystals having externally located 111-surfaces. It was found by such tests that etch patterns occur only on the 111-faces but not on the $\overline{111}$-faces. In the latter face, the etchant penetrates rapidly from any local fault at the crystal surface into the interior, whereas on the 111-face an etch pit can extend only slowly in the plane of the crystal face. The different 111-plane faces in these tests have been identified with the aid of X-rays.

The invention is based upon the concept of utilizing the electrochemical polarization along the (111)-axis, i.e. the different electrochemical potentials of the respective 111 and $\overline{111}$-faces, of such semiconductor crystals for the selecive electrolytic precipitation of metals upon pre-selected surfaces in the production of semiconductor devices. As a result of comprehensive investigations, it has been found that alkaline electrolyte baths that contain the metal to be precipitated in form of complex bonds are best suitable for such a selective precipitation.

For example when a monocrystalline ribbon-shaped dendrite of gallium arsenide whose two broad sides are (111)-surfaces are subjected to electrolytic metallization with zinc, the zinc will always precipitate upon the arsenic side of the dendrites if alkaline cyanide-containing zinc solutions are being employed, even if this side of the dendrites faces away from the counter electrode.

Cyanide-containing alkaline baths have likewise been found to be preferentially suitable for precipitating cadmium, copper, indium or silver upon semiconductor monocrystals having a lattice of the zinc-blende type.

For promoting such unilateral precipitation of tin upon the zinc-blende lattice crystal, the electrolyte is preferably given an addition of complexing agent consisting of ethylene-diamine tetra-acetic acid (Na-salt). For precipitation of zinc or copper, an aqueous solution of one or more salts of these metals may also be given an addition of complexing agent which, in lieu of cyanide, consists of EDTA (ethylene-diamine tetra-acetic acid).

The following examples relate to the deposition of metal upon the $\overline{111}$-surfaces of dendrites consisting of gallium arsenide or gallium phosphide whose broad sides are constituted by (111)-surfaces. For deposition of zinc it has been found advantageous to use an aqueous electrolyte bath containing the following composition per 1 liter of electrolyte solution:

(1)

| | G. |
|---|---|
| $Zn(CN)_2$ | 60 |
| NaCN | 42 |
| NaOH | 50 |

Indium has been most favorably precipitated upon from an electrolyte containing per liter of aqueous solution the following constituents:

(2)

| | G. |
|---|---|
| $InCl_3$ | 90 |
| KCN | 150 |
| KOH | 15 |

For the precipitation of tin, most favorable results have been obtained with a bath containing per liter of electrolyte solution in water the following constituents:

(3)

| | G. |
|---|---|
| $Na_2SnO_3 \cdot 3H_2O$ | 50 |
| NaOH | 12 |
| $CH_3COONa$ | 15 |
| Ethylene-diamine tetra-acetic acid (Na-salt) | 5–20 |

With all of these bath compositions, a precipitation of the particular metal has been observed to occur only at the $\overline{111}$-surfaces, these being the crystal faces whose outermost atom rows in $A^{III}B^{V}$ compounds is constituted by $B^{V}$-atoms, and in $A^{II}B^{VI}$ compounds is constituted by the $B^{VI}$-atoms. The selectivity is so perfect that it affords reliably identifying the 111-faces and the $\overline{111}$-faces of $A^{III}B^{V}$ and $A^{II}B^{VI}$ crystals. Thus the relative complicated method of identification with the aid of X-ray-techniques can be dispensed with in a simple manner.

It has further been found when practicing the method according to the invention that after a metal coating has been selectively deposited upon only one side of the monocrystal in the above-described manner, further metal, including metals different from the one originally precipitated, can be deposited from any desired electrolytic baths, upon the first metal coating without simultaneously precipitating upon the other side of the crystal. The first-deposited metal coating then acts in the sense of a catalyst that promotes further metallization in the subsequent electrolytic treatment. If desired, several metals may also be precipitated simultaneously upon the crystal.

After electrolytically depositing a metal coating upon the $\overline{111}$-face of the monocrystal by performing the above-described method of the invention until the deposited metal coating has the desired thickness, the metal is alloyed into the semiconductor surface in the conventional manner, namely by heating the coated crystal to the alloying temperature slightly above the melting point of the metal and then permitting the crystal to slowly cool to normal room temperature. For example, when alloying a tin coating of 1 to 10 micron thickness into the crystal an alloying temperature of 450–600° C. may be used for 30 to 5 seconds. These data, however, are not essential to the invention proper but can be chosen in accordance with conventional semiconductor-alloying techniques, depending upon the particular materials and the character of the metal-semiconductor junction to be produced. In any such cases, the production of semiconductor devices with fused or alloyed electrodes on preselected surface areas of the semiconductor crystal, according to the method of the invention, can be carried out in a relatively simple manner, as will be illustrated by the following examples.

EXAMPLE 1

The first example relates to the production of point or whisker-type diodes of gallium arsenide. Used is a gallium arsenide monocrystalline dendrite of ribbon shape doped for n-type conductance of which one broad ribbon surface is a 111-face and the opposite surface is a $\overline{111}$-face. The dendrite is immersed in an alkaline electrolyte which contains EDTA complexing agent according to the composition (3) specified above. Also immersed in the bath is an electrode of tin. A voltage of 6 volt is applied between the crystal and the tin electrode to maintain a current density of 3 ma. per cm.$^2$. The electrolysis is performed for 10 to 50 minutes to coat the GaAs crystal with a tin layer of about 1 to 5 micrometer thickness depending upon the duration. The resulting tin coating is limited to the $\overline{111}$-surface, regardless of the position of the dendrite relative to a tin electrode. Thereafter the dendrite is removed from the bath, rinsed and metallized with nickel which, as described above, precipitates only upon the previously tin-coated $\overline{111}$-surface. Used for precipitation of nickel is an aqueous nickel salt solution as conventionally employed and commercially available for nickel-plating purposes. The voltage applied between the crystal and the nickel electrode is 2.5 to 3.5 volt for a current density of 5 to 20 ma. per cm.$^2$. The nickel plating process is performed 2 to 5 minutes to produce a nickel coating of 0.2 to 0.5 micrometer thickness. After formation of the thin surface layer of nickel, the dendrite is placed upon a support of tantalum and heated for about 10 seconds in a hydrogen current at a temperature of approximately 500° C. As a result the tin is alloyed into the gallium arsenide surface and forms an electrode region of increased n-type conductance. That is, the resulting electrode forms an ohmic contact with the gallium arsenide crystal. The dendritic ribbon is thereafter divided into individual wafers or plates of smaller size, preferably with the aid of ultrasonics. A point electrode, such as a thin wire of zinc, is then contacted with the 111-surface of the individual wafers, and the point is alloyed into the surface by heating it at the above-mentioned temperature in a current of hydrogen, thus forming a p-n junction in the crystal immediately adjacent to the point contact.

EXAMPLE 2

The following example relates to the production of area-type junction diodes of gallium arsenside. Employed are ribbon-like dendrites of GaAs doped with silicon for n-type conductance. The $\overline{111}$-surface is first coated with tin by the method according to the invention and in the same manner as in the foregoing example. Thereafter the tin coating is covered with a surface layer of nickel, also as in Example 1. Now the metal-coated $\overline{111}$-surface is covered with masking varnish, and a layer of zinc (or nickel) is deposited in the conventional manner upon the exposed 111-surface. Thereafter the varnish is removed by means of acetic-acid ester. The coated dendrite is then heated for 10 seconds at about 500° C. for alloying the metal layers into the gallium arsenide dendrite. Thus, a barrier-free (ohmic) junction is formed at the transition from tin to n-type gallium arsenide, and a diode p-n junction is formed between the zinc and the n-type gallium arsenide.

In each of the above-described examples, the p-n junction contact may also be formed by using indium instead of zinc. Furthermore, the corresponding method steps are also applicable in the production of transistors and other semiconductor devices from gallium arsenide and the other above-mentioned $A^{III}B^{V}$ and $A^{II}B^{VI}$ compounds crystallizing in the zinc-blende lattice.

We claim:

1. The method of producing semiconductor members by alloying metal into a semiconductor crystal, which comprises employing a monocrystal of semiconductor compound selected from $A^{III}B^{V}$ and $A^{II}B^{VI}$ compounds having a zinc-blende lattice with surfaces in (111) planes; subjecting the crystal to electrolysis in an alkaline electrolyte containing a complex compound of the metal to be alloyed, whereby the metal selectively precipitates only upon the $\overline{111}$-surface of the crystal; and thereafter alloying the precipitated metal layer into the crystal.

2. The method of producing semiconductor members by alloying metal into a semiconductor crystal, which comprises employing a ribbon-shaped dendritic monocrystal of semiconductor compound selected from $A^{III}B^{V}$ and $A^{II}B^{VI}$ compounds having a zinc-blende lattice and having its two ribbon surfaces in (111) planes; subjecting the dendrite crystal to electrolysis in an alkaline electrolyte containing a complex compound of the metal to be alloyed, whereby the metal selectively precipitates only upon the $\overline{111}$-surface of the crystal; and thereafter alloying the precipitated metal layer into the crystal.

3. The method according to claim 1, wherein said monocrystal consists of gallium arsenide.

4. The method according to claim 1, wherein said monocrystal consists of gallium phosphide.

5. The method according to claim 1, wherein said monocrystal consists of indium phosphide.

6. The method according to claim 1, wherein said monocrystal consists of zinc sulphide.

7. The method according to claim 1, wherein said monocrystal consists of zinc selenide.

8. The method according to claim 1, wherein said monocrystal consists of cadmium sulphide.

9. The method of producing semiconductor members by alloying metal into a semiconductor crystal, which comprises employing a monocrystal fo semiconductor compound selected from $A^{III}B^{V}$ and $A^{II}B^{VI}$ compounds having a zinc-blende lattice with surfaces in (111) planes; subjecting the crystal to electrolysis in a cyanide-containing alkaline aqueous electrolyte which contains a complex compound of the metal to be alloyed, said metal being from the group consisting of zinc, cadmium, copper, indium and silver; whereby the metal selectively precipitates only upon the $\overline{111}$-surface of the crystal; and thereafter alloying the precipitated metal layer into the crystal.

10. The method of producing semiconductor members by alloying metal into a semiconductor crystal, which comprises employing a monocrystal of semiconductor compound selected from $A^{III}B^{V}$ and $A^{II}B^{VI}$ compounds having a zinc-blende lattice with surfaces in (111) planes; subjecting the crystal to electrolysis in an alkaline aqueous electrolyte containing ethylene-diamine tetra-acetic acid and a complex compound of the metal to be alloyed, said metal being from the group consisting of zinc, tin and copper.

11. The method of producing semiconductor members by alloying zinc into a semiconductor crystal, which comprises subjecting a monocrystal of a semiconductor compound selected from the group consisting of gallium arsenide and gallium phosphide, to electrolysis in an electrolyte having approximately the following composition per liter:

| | G. |
|---|---|
| $Zn(CN)_2$ | 60 |
| NaCN | 42 |
| NaOH | 50 |

whereby zinc selectively precipitates only on the $\overline{111}$-surface of the crystal; and thereafter alloying the precipitated zinc layer into the crystal.

12. The method of producing semiconductor members by alloying indium into a semiconductor crystal, which comprises subjecting a monocrystal of a semiconductor compound selected from the group consisting of gallium arsenide and gallium phosphide, to electrolysis in an electrolyte having approximately the following composition per liter:

| | G. |
|---|---|
| $InCl_3$ | 90 |
| KCN | 150 |
| KOH | 15 |

whereby indium selectively precipitates only on the $\overline{111}$-surface of the crystal; and thereafter alloying the precipitated indium layer into the crystal.

13. The method of producing semiconductor members by alloying tin into a semiconductor crystal, which comprises subjecting a monocrystal of a semiconductor compound selected from the group consisting of gallium arsenide and gallium phosphide, to electrolysis in an electroyte having approximately the following composition per liter:

| | G. |
|---|---|
| $Na_2SnO_3 \cdot 3H_2O$ | 50 |
| NaOH | 12 |
| $CH_3COONa$ | 15 |
| Ethylene-diamine tetra-acetic acid (Na-salt) | 5–20 |

whereby tin selectively precipitates only on the $\overline{111}$-surface of the crystal; and thereafter alloying the precipitated tin layer into the crystal.

14. The method according to claim 1, wherein a plurality of metals are simultaneously precipitated in said electrolyte.

References Cited

UNITED STATES PATENTS

| | | | |
|---|---|---|---|
| 2,814,589 | 11/1957 | Waltz | 204—37 |
| 2,825,667 | 3/1958 | Mueller | 148—1.5 |
| 2,873,232 | 2/1959 | Zimmerman | 204—1.5 |
| 2,902,419 | 9/1959 | Carasso et al. | 204—141 |
| 2,971,869 | 2/1961 | Taylor | 148—1.5 |
| 2,980,594 | 4/1961 | Pankove | 204—32 |
| 3,152,023 | 10/1964 | Minamoto | 148—177 |
| 2,978,661 | 4/1961 | Miller et al. | 338—22 |
| 3,075,892 | 1/1963 | John et al. | 204—15 |
| 3,097,977 | 7/1963 | Amick et al. | 148—6.14 |
| 3,261,773 | 7/1966 | Sandmann et al. | 204—242 |

FOREIGN PATENTS

| | | |
|---|---|---|
| 1,121,427 | 7/1960 | Germany. |

HOWARD S. WILLIAMS, *Primary Examiner.*

JOHN H. MACK, *Examiner.*

W. VAN SISE, *Assistant Examiner.*